(12) United States Patent
Spella et al.

(10) Patent No.: US 10,615,134 B2
(45) Date of Patent: Apr. 7, 2020

(54) INTEGRATED CIRCUIT PACKAGE

(71) Applicant: NXP B.V., Eindhoven (NL)

(72) Inventors: Maristella Spella, Eindhoven (NL); Waqas Hassan Syed, Eindhoven (NL); Daniele Cavallo, Rijswijk (NL); Mingda Huang, Eindhoven (NL); Leo Van Gemert, Nijmegen (NL)

(73) Assignee: NXP B.V., Eindhoven (NL)

( * ) Notice: Subject to any disclaimer, the term of this patent is extended or adjusted under 35 U.S.C. 154(b) by 102 days.

(21) Appl. No.: 15/871,440

(22) Filed: Jan. 15, 2018

(65) Prior Publication Data

US 2018/0233465 A1    Aug. 16, 2018

(30) Foreign Application Priority Data

Feb. 15, 2017    (EP) ..................................... 17156367

(51) Int. Cl.
*H01L 23/66* (2006.01)
*H01Q 19/10* (2006.01)
(Continued)

(52) U.S. Cl.
CPC ........ *H01L 23/66* (2013.01); *H01L 23/49816* (2013.01); *H01L 23/49827* (2013.01); *H01L 25/0657* (2013.01); *H01Q 1/2283* (2013.01); *H01Q 1/40* (2013.01); *H01Q 13/16* (2013.01); *H01Q 15/10* (2013.01); *H01Q 19/09* (2013.01); *H01Q 19/10* (2013.01); *H01Q 19/28* (2013.01); *H01Q 21/064* (2013.01); *H01L 23/3128* (2013.01); *H01L 24/16* (2013.01);
(Continued)

(58) Field of Classification Search
CPC ........ H01Q 1/2283; H01Q 1/40; H01Q 13/10; H01Q 13/16; H01Q 15/10; H01Q 19/09; H01L 23/66
See application file for complete search history.

(56) References Cited

U.S. PATENT DOCUMENTS

2015/0061924 A1    3/2015    Binzer et al.
2015/0084830 A1    3/2015    Elsherbini et al.
(Continued)

FOREIGN PATENT DOCUMENTS

EP    2 178 119 A1    4/2010
JP    201-0263413 A    11/2010

OTHER PUBLICATIONS

PourMousavi, M. et al. "The impact of embedded wafer level BGA package on the antenna performance", IEEE-APS Topical Conference on Antennas and Propagation in Wireless Communications, pp. 828-831 (2013).
Hamidipour, A. et al. "Antennas in package with stacked metallization", European Microwave Conference, Nuremberg, Germany, pp. 56-59 (Oct. 2013).
Zhang, Y.P. et al. "Antenna-on-Chip and Antenna-in-Package Solutions to Highly Integrated Millimeter-Wave Devices for Wireless Communications", IEEE Transactions on Antennas and Propagation, vol. 57, No. 10, pp. 2830-2841 (Oct. 2009).
(Continued)

*Primary Examiner* — Robert Karacsony
(74) *Attorney, Agent, or Firm* — Rajeev Madnawat (57) ABSTRACT

An integrated circuit package is described comprising an integrated circuit die and an antenna structure coupled to the integrated circuit die and comprising a stacked arrangement of metal and dielectric layers, wherein a first metal layer includes a planar antenna and at least one further metal layer comprises an artificial dielectric layer. The integrated circuit package may improve the directionality of the antenna and reduces the sensitivity of the antenna to the printed circuit board on which the integrated circuit package is mounted.

12 Claims, 7 Drawing Sheets

(51) Int. Cl.
| | |
|---|---|
| H01Q 19/28 | (2006.01) |
| H01Q 1/22 | (2006.01) |
| H01Q 1/40 | (2006.01) |
| H01Q 15/10 | (2006.01) |
| H01Q 21/06 | (2006.01) |
| H01Q 19/09 | (2006.01) |
| H01Q 13/16 | (2006.01) |
| H01L 23/498 | (2006.01) |
| H01L 25/065 | (2006.01) |
| H01L 23/31 | (2006.01) |
| H01L 23/00 | (2006.01) |

(52) U.S. Cl.
CPC .............. *H01L 24/20* (2013.01); *H01L 24/32* (2013.01); *H01L 24/73* (2013.01); *H01L 24/92* (2013.01); *H01L 2223/6627* (2013.01); *H01L 2223/6677* (2013.01); *H01L 2223/6683* (2013.01); *H01L 2224/04105* (2013.01); *H01L 2224/12105* (2013.01); *H01L 2224/16227* (2013.01); *H01L 2224/24195* (2013.01); *H01L 2224/32225* (2013.01); *H01L 2224/73204* (2013.01); *H01L 2224/92125* (2013.01); *H01L 2924/10253* (2013.01); *H01L 2924/10329* (2013.01); *H01L 2924/14* (2013.01); *H01L 2924/1421* (2013.01); *H01L 2924/1423* (2013.01); *H01L 2924/15192* (2013.01); *H01L 2924/15311* (2013.01); *H01L 2924/15321* (2013.01); *H01L 2924/30105* (2013.01)

(56) References Cited

U.S. PATENT DOCUMENTS

| | | |
|---|---|---|
| 2016/0006131 A1 | 1/2016 | Matsumura et al. |
| 2016/0087333 A1 | 3/2016 | Tong et al. |
| 2017/0155185 A1* | 6/2017 | Hong ..................... H01Q 1/24 |
| 2018/0205134 A1* | 7/2018 | Khan ..................... H01Q 11/08 |
| 2019/0115643 A1* | 4/2019 | Khan ..................... H01P 5/107 |

OTHER PUBLICATIONS

Kock, W. E. "Metallic delay lenses", Bell System Tech., J., vol. 27, No. 1, pp. 58-82, (Jan. 1948).

Syed, W. H. et al. "Front-to-Back Ratio Enhancement of Planar Printed Antennas by Means of Artificial Dielectric Layers", IEEE Transactions on Antennas and Propagation, vol. 61, No. 11, pp. 5408-5416 (Nov. 2013).

Syed, W. H. et al. "Design, Fabrication, and Measurements of a 0.3 THz On-Chip Double Slot Antenna Enhanced by Artificial Dielectrics", IEEE Transactions on Terahertz Science and Technology, vol. 5, No. 2, pp. 288-298 (Mar. 2015).

Jones, S. S. D. et al. "Metallic Delay Lenses", Nature, vol. 163, No. 4139, pp. 324-325 (Feb. 26, 1949).

Pendse, R. "eWLB: A Transformative Fan-out Packaging Technology for High Performance, Integration and Small Form Factors", STATSChipPAC, MEPTEC meeting, retrieved from the internet at: meptec.org/Resources/June%208%20STATS%20ChipPAC.pdf (Jun. 2011).

\* cited by examiner

INTEGRATED CIRCUIT PACKAGE

CROSS-REFERENCE TO RELATED APPLICATIONS

This application claims the priority under 35 U.S.C. § 119 of European Patent application no. 17156367.9, filed on Feb. 15, 2017, the contents of which are incorporated by reference herein.

FIELD

This disclosure relates to an integrated circuit package including an antenna.

BACKGROUND

RF devices for millimeter-wave (mm-wave) applications such as car radar may include an antenna integrated in the integrated circuit package, which may also be referred to as an antenna-in-package. At mm-wave frequencies, the RF-performance of the system is no longer determined only by the transceiver circuits and the antenna, but also strongly depends on the package and the interconnection between the transceiver and the antenna. An example package type used for antenna-in-package devices is a fan-out package for example the embedded wafer-level ball-grid-array (eWLB). The eWLB typically includes a mold compound surrounding the packaged semiconductor die or dice. The eWLB package may have one redistribution layer (RDL) on the same major surface of the package as the solder balls of the ball grid array (BGA). Some eWLB packages may have a second redistribution layer on the opposite major surface to the solder balls. Vias formed through the mold compound may be used to electrically connect the first and second redistribution layers. The opposite major surfaces of the eWLB package may also be referred to as the front-side and back-side of the package.

Antenna-in-packages using the eWLB package concept may form a planar antenna in one of the redistribution layers. To improve the power radiation of the antenna in the target direction, a reflector is typically implemented. In some implementations, this reflector uses the top layer metal of an external printed circuit board to which the package is soldered. In this case, the effectiveness of the reflector depends on the soldering process, since the height of solder balls defines the distance between the reflector and the antenna. A variation in this height can consequently affect the matching and insertion loss of the antenna.

An alternative example in eWLB packages with two redistribution layers integrates a reflector into the package using the metal layer of one of the redistribution layers and integrates an antenna into the other redistribution layer. In this case, the antenna performance strongly depends on the mold thickness since at higher frequencies the surface wave loss can be very high which can deteriorate the far-field radiation pattern and the antenna gain in the desired direction. This surface wave loss may result in the antenna efficiency being reduced to 40% or lower.

In general, the antenna performance is affected by the package thickness that, in the eWLB package, is electrically thick in the mm-wave frequency range. The eWLB package itself supports propagation of guided waves (surface waves) that bounce within the package making the antenna performance very sensitive to the package dimensions.

Furthermore, the antenna is in close proximity to the chip consisting mainly of material such as silicon or gallium-arsenide that has a high relative dielectric constant above 10. Consequently, a significant portion of the radiated power tends to couple with the integrated circuit die or chip rather than being radiated outside the package. This may result in asymmetric and degraded radiation patterns from the antenna.

SUMMARY

Various aspects of the disclosure are defined in the accompanying claims. In a first aspect, there is defined an integrated circuit package comprising: an integrated circuit die, an antenna structure coupled to the integrated circuit die and comprising a stacked arrangement of metal and dielectric layers, wherein a first metal layer includes a planar antenna and at least one further metal layer comprises an artificial dielectric layer.

In one or more embodiments, the antenna structure may comprise: a second metal layer including an antenna feed structure, the antenna feed structure being electrically connected to the integrated circuit die, wherein the planar antenna is configured to be electro-magnetically coupled to the antenna feed structure.

In one or more embodiments, the first metal layer may further comprise an antenna feed structure and the planar antenna may be configured to be electro-magnetically coupled to the antenna feed structure.

In one or more embodiments, the planar antenna may comprise at least two slots.

In one or more embodiments, the integrated circuit package may comprise an array of four planar antennas.

In one or more embodiments of the integrated circuit package the artificial dielectric layer may comprise a plurality of metal shapes arranged in a grid.

In one or more embodiments of the integrated circuit package the at least one further layer comprises a first further metal layer and a second further metal layer wherein each of the first and second further metal layers are at least partially patterned to form artificial dielectric layers.

In one or more embodiments of the integrated circuit package the antenna structure may comprise a multi-layer printed circuit board.

In one or more embodiments of the integrated circuit package, the antenna structure and the integrated circuit die may be vertically stacked.

In one or more embodiments of the integrated circuit package, the integrated circuit die may be a monolithic microwave integrated circuit.

In one or more embodiments, the integrated circuit package may comprise a first redistribution layer including a redistribution metal layer wherein the integrated circuit is electrically connected to the antenna structure via the redistribution metal layer.

In one or more embodiments of the integrated circuit package, the redistribution metal layer may form part of the antenna structure.

One or more embodiments of the integrated circuit package may further comprise a second redistribution layer wherein at least one artificial dielectric layer is formed in at least one of the first redistribution layer and the second redistribution layer.

Embodiments of the integrated circuit package may be included in an embedded wafer level ball grid array package.

Embodiments of the integrated circuit package may be included in a radar device for an automotive vehicle.

In the figures and description like reference numerals refer to like features. Embodiments are now described in detail, by way of example only, illustrated by the accompanying drawings in which.

DESCRIPTION

Figure 1A:
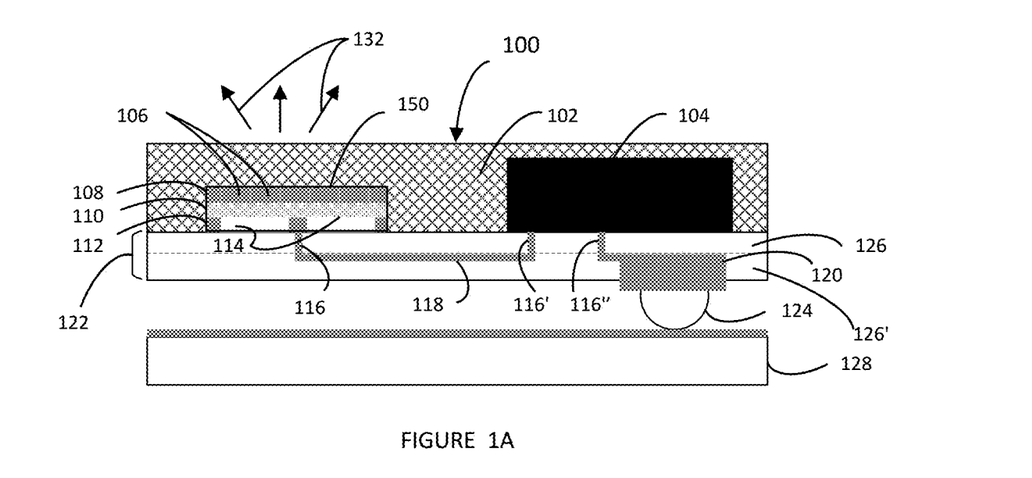
FIG. 1A shows a cross-section of an integrated circuit package according to an embodiment.

FIG. 1A shows a cross-section of an integrated circuit package 100 implemented as an embedded wafer level BGA according to an embodiment. The integrated circuit package 100 includes an antenna structure 150 including a stacked arrangement of a first metal layer 108 and a second metal layer 112 separated by a dielectric layer 110. The antenna structure 150 may be implemented using a multilayer printed circuit board (PCB). The first metal layer 108 may be patterned to include a regular grid of metal squares 106. The second metal layer 112 may form a planar slot antenna 114 with a co-planar wave-guide feeder structure (not shown). The antenna structure 150 may transmit in direction 132.

The integrated circuit package 100 also includes an integrated circuit die 104 that may implement for example a radio frequency (RF) transceiver. In some examples, the integrated circuit die 104 may be a monolithic microwave integrated circuit (MIMIC). The integrated circuit die 104 and the antenna 105 may be embedded in mold compound 102. A redistribution layer (RDL) 122 may be formed on one of the major surfaces of the mold compound 102. This process may be referred to as RDL last.

The redistribution layer 122 may include a first dielectric layer 126, a redistribution metal layer 118, a second dielectric layer 126' and optionally an under-bump metallization (UBM) pad 120 onto which the solder balls 124 of the ball grid array may be attached. It will be appreciated that the BGA will typically have a number of pads and solder balls arranged in a grid which are then soldered to a printed circuit board 128 external to the integrated circuit package 100. One or more vias 116, 116', 116" may be formed in the first di-electric 126 on the redistribution layer 122 to electrically connect the integrated circuit die 104 to the pads 120 of the ball grid array. The integrated circuit die 104 may be electrically connected to the second metal layer 112 of the antenna structure with vias 116, 116' and the redistribution metal layer 118.

Figure 1B:
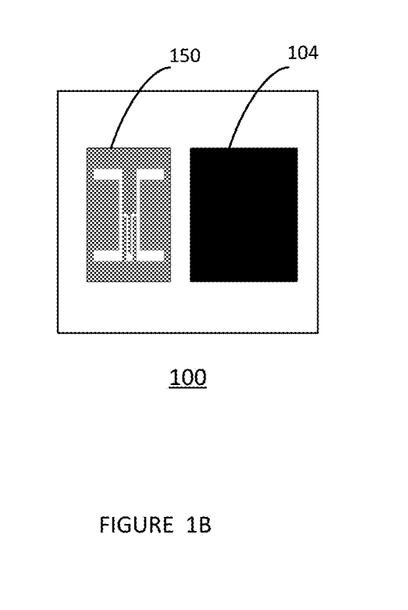
FIG. 1B shows a plan view of the integrated circuit package of FIG. 1A.

FIG. 1B shows a plan view of the integrated circuit package of FIG. 1A showing the relative arrangement of the antenna structure 150 and the die 104.

Figure 1C:
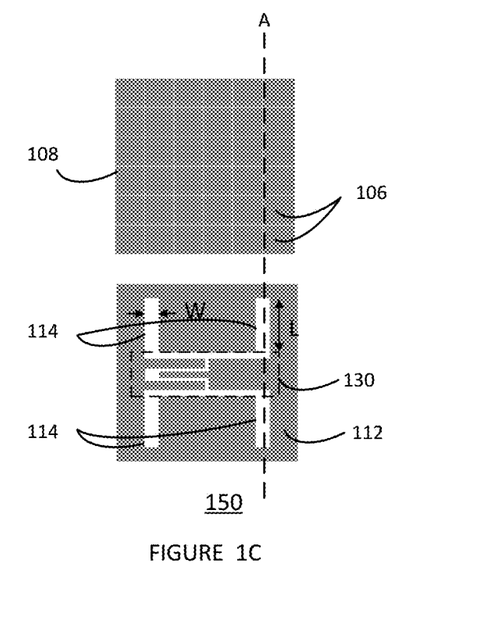
FIG. 1C shows a plan view of the metal layers of the antenna structure included in the integrated circuit package of FIG. 1A.

Further details of the antenna structure 150 may be understood with reference to FIG. 1C which shows a plan view of the metal layers 108, 112 of the antenna structure 150. The dashed line denoted A indicates the cross-section of the metal layers 108, 112 shown in FIG. 1A. The first metal layer 108 may be patterned to include a regular grid of metal squares 106. The metal squares 106 on the first metal layer 108 may be referred to as an artificial dielectric layer (ADL) or capacitive grid. The maximum dimension of each of the metal squares 106 must be less than a quarter of the wavelength of the dielectric hosting the artificial dielectric layer 106 of the transmitted wave to ensure that they are non-resonant. In other examples, different metal shapes such as circles, hexagons, rectangles arranged periodically may also be used to form an ADL or capacitive grid.

The inclusion of one or more ADLs 106 in the hosting dielectric 110 increases the effective permittivity, which may result in improved directionality of the antenna so that it transmits more of the energy in desired direction 132. For an isotropic material, a high relative permittivity (>10) may cause strong reflections at the material-air interface supporting surface waves. Due to their anisotropic behaviour, the ADLs synthesize high relative permittivity (>10) for radiation that travels normal to the metal layers, but low effective permittivity for radiation that travels parallel to the metal layers. The permittivity for radiation that travels parallel to the metal layers is determined by the relative permittivity of the hosting dielectric which is typically much lower, for example less than 5. This anisotropic behaviour may reduce the reflection at the top interface of the package and decrease the power lost into surface waves. The integrated circuit package 100 may reduce losses due to surface waves compared with known antenna-in-package solutions.

The second metal layer 112 may form a planar slot antenna 114 with a co-planar wave-guide feeder structure 130. In other examples, different planar antennas, for example patch, dipole and loop antennas, may be used. In other examples different feeder structures, for example single ended and differential feeder structures, H-slot coplanar waveguide feed, H-slot microstrip feed, Corporate feeding networks using either a coplanar waveguide feed or microstrip feed, or differential microstrip feeds may be implemented. In some examples, feeder structure 130 and the planar slot antenna 114 can also be formed directly using redistribution metal layer 118. In this case via 116 and the second metal layer 112 may be omitted.

The integrated circuit package 100 may result in improved antenna performance without the need for a reflector. A reflector typically requires a relatively large area, which may result in a larger package, and/or constraints on the metal routing required in either the redistribution layer 112 or the external printed circuit board 128. The antenna structure 150 does not require any vias between the metal layers 108 and 112. By reducing or eliminating the vias between the metal layers, the insertion loss at mm Wave frequencies may be reduced and the use of an additional matching circuit may be avoided. In addition, the cost and complexity of manufacturing an integrated circuit package including an antenna may be reduced. The integrated circuit package 100 may result in improved antenna-in-package performance with a reduced package size. Since the antenna structure 150 may be implemented as a printed circuit board, the distance between the layers can be more accurately controlled than for example the height of the solder balls 124 with respect to an external PCB 128. This may reduce the variation in performance of the antenna compared to antenna-in-package solutions that require an external reflector.

The artificial dielectric layer 106 may be designed independently of the particular planar antenna and may be implemented so that it is above or overlaps the antenna. However, there is no requirement for fine alignment between the artificial dielectric layer and the planar antenna. This may allow implementation of the antenna structure 150 using standard printed circuit board thin-film manufacturing techniques. The integrated circuit package 100 may be implemented using an eWLB package. However, since the antenna structure 150 may be implemented as a multi-layer printed circuit board (PCB), it will be appreciated that other BGA packaging technologies may be used.

The integrated circuit package 100 may implement a mm-wave transceiver device with an integrated antenna operating at frequencies above 120 GHz. In other examples, the integrated circuit package may implement a transceiver for use in a car radar system operating at a frequency range of 76 GHz to 81 GHz and in applications such as a parking aid, lateral collision avoidance, gesture recognition. In other examples, the integrated circuit package 100 may implement a transceiver for use in multi-gigabit communication system which may operate at a frequency of 60 GHz. In other examples, the integrated circuit package 100 may implement a transceiver operating at frequencies greater than 40 GHz.

Figure 2A:
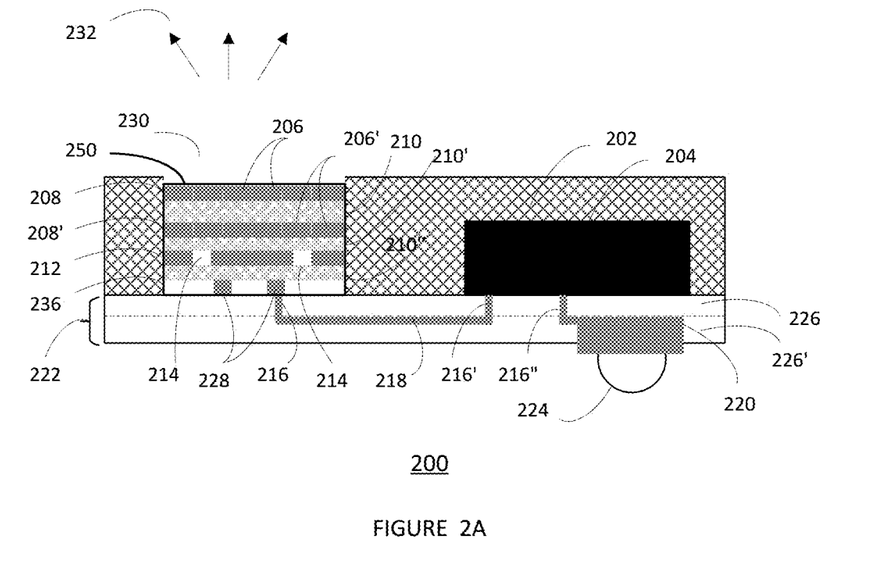
FIG. 2A shows a cross-section of an integrated circuit package according to an embodiment.

FIG. 2A shows a cross-section of an integrated circuit package 200 implemented as an embedded wafer level BGA according to an embodiment. The integrated circuit package 200 includes an antenna structure 250 including a stacked arrangement of a first metal layer 208, a second metal layer 208', a third metal layer 212 and fourth metal layer 236. The metal layers 208, 208', 212, 236 are separated by dielectric layers 210, 210', 210". The first metal layer 208 may be patterned to include a regular grid of metal squares 206. The metal squares 206 patterned on the first metal layer 208 may be referred to as a first artificial dielectric layer (ADL). The second metal layer 208' may be patterned to include a regular grid of metal squares 206'. The metal squares 206' patterned on the second metal layer 208' may be referred to as a second artificial dielectric layer (ADL). The artificial dielectric layers 206, 206' may improve the gain of the antenna by enhancing the amount of radiation in a desired direction indicated by the arrows 232. The antenna structure 250 may be implemented using a multilayer printed circuit board. The integrated circuit package 200 also includes an integrated circuit die 204 which may implement for example a radio frequency (RF) transceiver. In some examples, the integrated circuit die 204 may be a monolithic microwave integrated circuit (MMIC). The integrated circuit die 204 and the antenna structure 250 may be embedded in a mold compound 202. An aperture 230 may be formed in the mold compound 202 so that a surface of the antenna structure 250 is exposed. A redistribution layer (RDL) 222 may be formed on the opposite surface of the mold compound 202 to the aperture 230.

The redistribution layer 222 may include a first dielectric layer 226, a redistribution metal layer 218, a second dielectric layer 226' and optionally an under-bump metallization (UBM) pad 220 onto which the solder balls 224 of the ball grid array may be attached.

It will be appreciated that the integrated circuit package 200 has a number of pads and solder balls arranged in a grid which may be soldered to an external printed circuit board (not shown). One or more vias 216, 216', 216" may be formed in the first dielectric layer 226 for electrically connecting the integrated circuit die 204 to the pads 220 of the ball grid array and the antenna structure 250. Differential feeding lines 228 may be implemented in a fourth metal layer 236 of the antenna structure 250. The integrated circuit die 204 may be electrically connected to the differential feeding lines 228 with vias 216, 216' and the redistribution metal layer 218. Only one connection between the antenna structure 250 and the integrated circuit die 204 is shown explicitly. The skilled person will appreciate that further vias and metal tracks in redistribution metal layer 218 may be used to make further electrical connections between the die 204 and the fourth metal layer 236 of the antenna structure 250. The third metal layer 212 may include a planar dual-slot antenna 214. The slots 214 may be dimensioned so that they are matched at a required resonant frequency. For example, for car radar applications, the slot length dimensions may be selected to be close to half wavelength long at 77 GHz. In this case the slot is tuned to a first resonance frequency. In other examples the length may be chosen with a dimension close to the wavelength to tune for the second resonance frequency. In general, the slot length is chosen dependent on the frequency or range of frequencies for which the antenna is to be tuned.

The differential feeder structure may be electromagnetically coupled to the dual-slot antenna 214 in operation and so no vias are required between the third metal layer 212 and the fourth metal layer 236. In other examples, different planar antennas and different feeder structures may be implemented. For example, the differential feeder structure may be implemented using the redistribution metal layer 218. In this case, the redistribution layer 222 may be considered to form part of the antenna structure and the fourth metal layer 216 and dielectric layer 210" may be omitted.

Figure 2B:
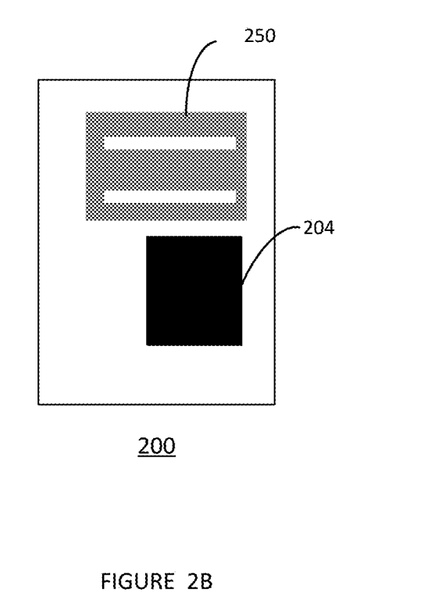
FIG. 2B shows a plan-view of the integrated circuit of FIG. 2A.

FIG. 2B shows a plan view of the integrated circuit package of FIG. 2A showing the relative arrangement of the antenna structure 250 and the die 204.

Figure 2C:
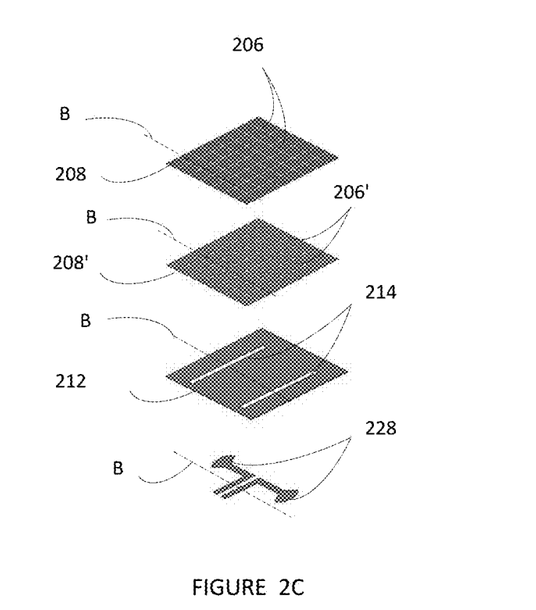
FIG. 2C shows a 3-D view of the metal layers of the antenna structure included in the integrated circuit package of FIG. 2A.

Further details of the antenna structure 250 may be understood with reference to FIG. 2C which shows a plan view of the metal layers of the antenna structure 250. The dashed line denoted B indicates the cross-section of the metal layers shown in FIG. 2A. The artificial dielectric formed by the first ADL 206, the dielectric layer 210 and the second ADL 206' typically increases the effective dielectric constant compared to the dielectric constant of the host material, i.e. the material forming the dielectric layers 210, 210' and 210". This increase in effective dielectric constant may improve the directionality of the antenna structure. The patterning on the first metal layer 208 and the second metal layer 208' may be aligned but can be misaligned within the normal tolerances of a multi-layer PCB manufacturing process. In other examples, the first and second artificial dielectric layers 206, 206' may be misaligned by design. This may further increase the effective permittivity of the artificial dielectric. The patterning of the artificial dielectric layers 206, 206' on the first metal layer 208 and the second metal layer 208' may be identical.

The ADLs 206, 206' in the integrated circuit packages 200 form an equivalent dielectric medium due to two effects. Firstly, the capacitance of a ADL single layer or capacitive grid, which also is the case for integrated circuit package 100, and secondly the capacitance between the ADL layers 206, 206'.

A combination of these two capacitances results in the incident RF wave being delayed in time. This delay translates to an equivalent medium which has higher permittivity when compared to the dielectric constant of the material hosting the ADL layers.

However, in the case of a single layer the effect of the inter-layer capacitance is absent. Therefore, the overall capacitance (hence delay) is smaller than the case when the cascade of two or more layers is used. However, the capacitance of a single layer of ADL may be chosen to obtain the antenna matching which is very similar to that of two layers (i.e. <=−10 dB from 76-81 GHz).

The equivalent dielectric medium formed by one or more ADL layers 206, 206' may result in improved the directionality of antenna gain in the desired direction. The integrated circuit package 200 may result in improved antenna performance without the need for a reflector.

A reflector typically requires a relatively large area which may result in a larger package and/or constraints on the metal routing required in either the redistribution layers or the external printed circuit board. A reflector may impose constraints on the package for example requiring a clearance area on the package with no solder balls. Having fewer solder balls may reduce the mechanical strength of the package when soldered onto an external PCB, which may reduce the reliability of the circuit and/or package. By removing the requirement for a reflector, an electronic system including the integrated circuit package 200 may have improved reliability.

Furthermore, the antenna structure 250 does not require any vias between any of the metal layers 208, 208', 212, and 236. The integrated circuit package 200 may result in improved antenna-in-package performance with a reduced package size. Since the antenna structure 250 may be implemented as a printed circuit board, the distance between the layers can be more accurately controlled than for example the height of the solder balls 224 with respect to an external printed-circuit board. The performance of the antenna structure 250 may be more predictable compared to antenna-in-package solutions that require an external reflector.

The artificial dielectric layers may be designed independently of the particular planar antenna and although, the ADLs may be implemented above or overlapping the antenna, there is no requirement for fine alignment between the artificial dielectric layer and the antenna or between artificial dielectric layers. This allows implementation using standard printed circuit board thin-film manufacturing techniques. The integrated circuit package 200 may be implemented as an eWLB package.

Figure 3A:
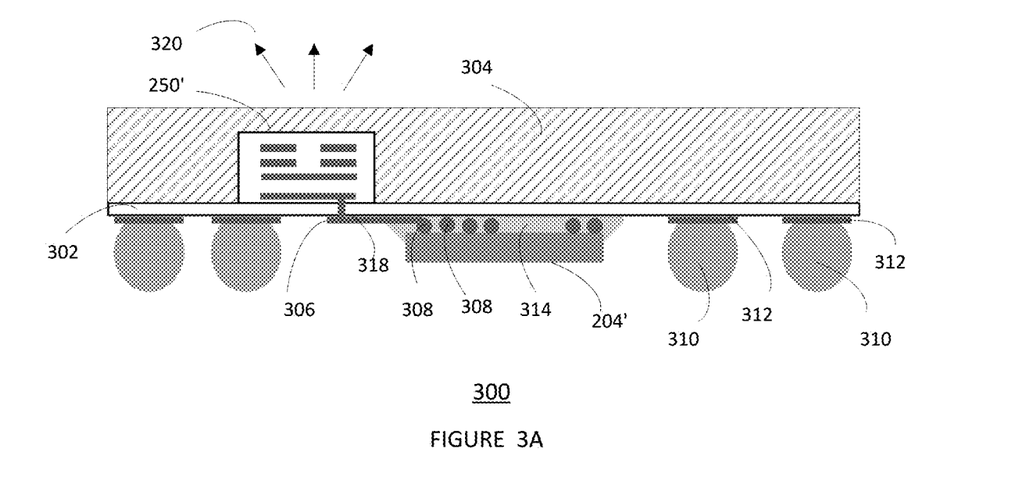
FIG. 3A shows an integrated circuit package including an integrated antenna according to an embodiment.

FIG. 3A shows a flip chip BGA integrated circuit package 300 including an integrated antenna. The integrated circuit package 300 has a substrate 302 including a number of metal layers separated by dielectric layers (not shown). The substrate 302 is typically formed using a standard printed circuit board fabrication process. An antenna structure 250' similar to that described in FIG. 2 may be formed as a multi-layer printed circuit board and attached to the substrate 302. The antenna structure 250' may be over-molded by mold compound 304. A die 204' may be mounted on the same side of the substrate 302 as the UBM pads 312 which have solder balls 310 attached. In other examples, the die 204' may be mounted on the opposite side of the substrate 302. The die 204' may be electrically connected to the UBM pads with flip-chip bumps 308 connected to the redistribution metal layer used to form the UBM pads 312. An underfill adhesive 314 may be added between the die 204' and the multilayer substrate 304. The die 204' may be electrically connected to the antenna structure by metal connection 306 and via 318. The antenna structure 250' includes artificial dielectric layers as previously described for FIG. 2. Since the antenna structure 250' may be implemented as a printed circuit board, the distance between the layers can be more accurately controlled than for example the height of the solder balls 310 with respect to an external printed-circuit board. The performance of the antenna structure 250' may be more predictable compared to antenna-in-package solutions that require an external reflector. It will be appreciated that other antenna structures described herein may also be used instead of antenna structure 250'. As shown the antenna structure 250' is shown offset to the side of the die 204'. It will be appreciated that other arrangements of the die 204' and the antenna structure 250' are possible. In some examples the antenna structure 250' may be arranged directly above the die 204' in a vertical stack. In operation, the antenna structure 250' may preferentially transmit radiation in the direction 320' due to the artificial dielectric layers. It will be appreciated that the antenna structure 250' may preferentially receive RF signals from the opposite direction to direction 320'.

Figure 3B:
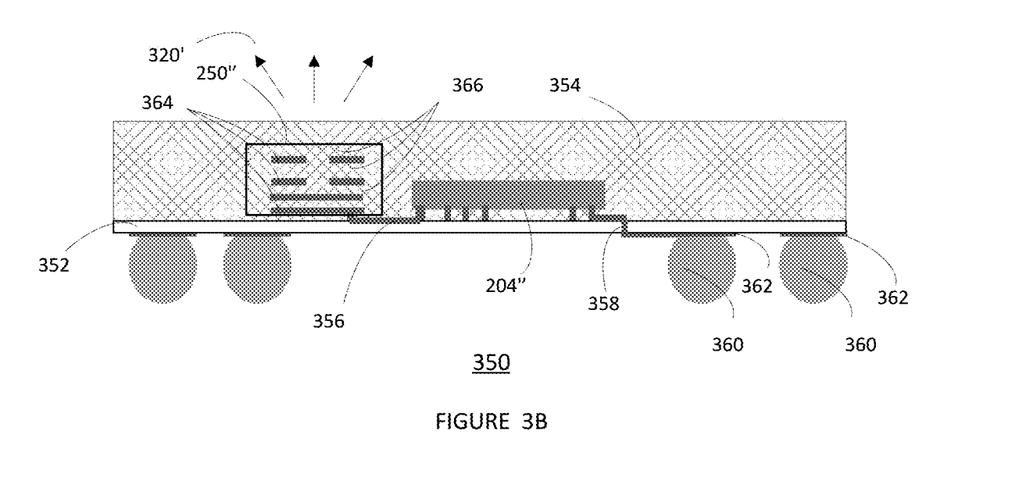
FIG. 3B shows an integrated circuit package including an integrated antenna according to an embodiment.

FIG. 3B shows an embedded die BGA integrated circuit package 350 including an integrated antenna. The integrated circuit package 350 has a first substrate 352 and a multi-layer substrate 352 including a number of metal layers 364 separated by dielectric layers 366 formed above the first substrate 352. The multi-layer substrate 354 is typically formed using a standard printed circuit board fabrication process. The die 204" is mounted on the substrate 352 and connected to UBM pads 362 with vias 358 formed in the substrate 352. The UBM pads 362 may have solder balls 360 attached. An antenna structure 250" similar to that described in FIG. 2 may be formed within the multi-layer substrate 354. The die 204" may be located within a cavity formed in the multi-layer substrate 354 and electrically connected to the antenna structure 250" by metal connection 356. The antenna structure 250" includes artificial dielectric layers as previously described for FIG. 2, which may reduce antenna losses. Since the antenna structure 250" may be implemented as a printed circuit board formed in the multi-layer substrate 354, the distance between the layers can be more accurately controlled than, for example, the height of the solder balls 360 with respect to an external printed-circuit-board. The performance of the antenna structure 250" may be more predictable compared to antenna-in-package solutions that require an external reflector. It will be appreciated that other antenna structures described herein may also be used instead of antenna structure 250''. In operation, the antenna structure 250'' may preferentially transmit radiation in the direction 320 due to the artificial dielectric layers. In other examples, the antenna 250'' may be formed using a separate printed circuit board similar to antenna 250. In this case, the antenna may be placed within a cavity in the multi-layer substrate 354.

Figure 4A:
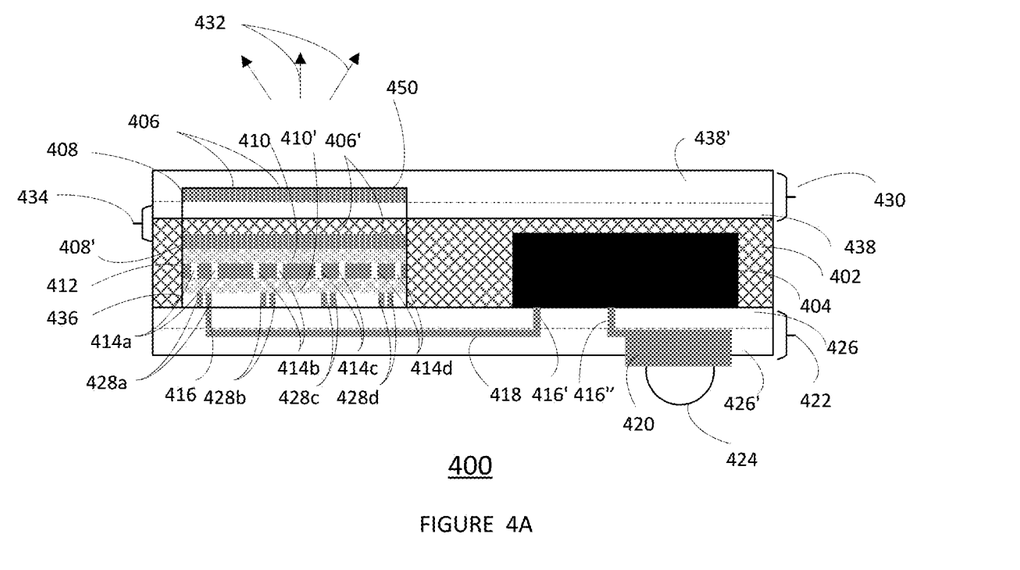
FIG. 4A shows a cross-section of an integrated circuit package according to an embodiment.

FIG. 4A shows a cross-section of an integrated circuit package 400 implemented as an embedded wafer level BGA with a front-side redistribution layer 430 and a back-side redistribution layer 422 according to an embodiment.

The back-side redistribution layer 422 may be formed on a first major surface of the mold compound 402. The back-side redistribution layer 422 may include a first dielectric layer 426, a redistribution metal layer 418, a second dielectric layer 426' and optionally an under-bump metallization (UBM) pad 420 onto which the solder balls 424 of the ball grid array may be attached.

The front-side redistribution layer 430 may be formed on a second major surface of the mold compound 402. The front-side redistribution layer 430 may include a first dielectric layer 438, a redistribution metal layer 408, a second dielectric layer 438'.

The integrated circuit package 400 may have an antenna structure 450 including a stacked arrangement of a first metal layer which may be the front-side redistribution metal layer 408, a second metal layer 408', a third metal layer 412 and fourth metal layer 436. The first metal layer 408 may be patterned to include a regular grid of metal squares 406. The second metal layer 408' may be patterned to include a regular grid of metal squares 406'. The first metal layer 408 and second metal layer 408' are separated by a dielectric 434 formed by the mold compound 402 which acts as a dielectric layer and the first dielectric layer 438 of the front-side redistribution layer 430. The second metal layer 408' and third metal layer 412 are separated by dielectric layer 410. The third metal layer 412 and fourth metal layer 436 are separated by dielectric layer 410'. The third metal layer 412 may include an array of four planar dual-slot antennas 414a-d. The second metal layer 408', third metal layer 412 and fourth metal layer 436 of the antenna structure 450 and dielectric layers 410, 410' may be implemented as a multi-layer printed circuit board. The antenna structure 450' may enhance the amount of radiation in a desired direction 432. It will also be appreciated that the antenna structure 450' may preferentially receive RF signals from the opposite direction to the desired transmission direction 432.

The integrated circuit package 400 also includes an integrated circuit die 404 which may implement for example a radio frequency (RF) transceiver. In some examples, the integrated circuit die 404 may be a monolithic microwave integrated circuit (MMIC). The integrated circuit die 404 and at least part of the antenna structure 450 may be embedded in the mold compound 402.

It will be appreciated that the eWLB package will typically have a number of pads and solder balls arranged in a grid which are then soldered to an external printed circuit board (not shown). One or more vias 416, 416', 416'' may be formed in the first dielectric layer 426 of the back-side redistribution layer 422 to electrically connect the integrated circuit die 404 to the pads 420 of the ball grid array and the antenna structure 450. The integrated circuit die 404 may be electrically connected to the differential feeder structure 428a implemented in the fourth metal layer 436 of the antenna structure with vias 416, 416' and the redistribution metal layer 418. Only one connection is shown explicitly, it will be appreciated that connections to the differential feeder structures 428b, 428c, 428d may be similarly formed. The skilled person will appreciate that further vias and metal tracks in redistribution metal layer 418 may be used to make further electrical connections between the die 404 and the fourth metal layer 436 of the antenna structure 450.

Figure 4B:
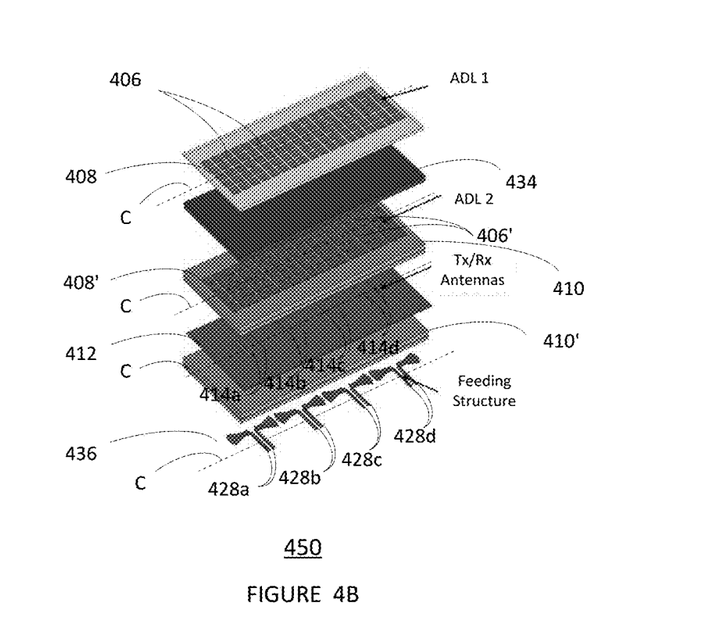
FIG. 4B shows a 3-D view of the metal layers of the antenna structure included in the integrated circuit package of FIG. 4A.

Further details of the antenna structure 450 may be understood with reference to FIG. 4B which shows a plan view of the metal layers of the antenna structure 450. The dashed line denoted C indicates the cross-section of the metal layers shown in FIG. 4A. The first metal layer 408 may be patterned to include a regular grid of metal squares 406. The second metal layer 408' may be patterned to include a regular grid of metal squares 406'. The metal squares 406 on the first metal layer 408 and the metal squares 406' patterned on the second metal layer 408' may effectively act as first and second artificial dielectric layers (ADL). The patterning on the first metal layer 408 and the second metal layer 408' may be aligned but can be misaligned within the normal tolerances of a multi-layer PCB manufacturing process. The patterning on the first metal layer 408 and the second metal layer 408' may be identical. The first ADL 406, the second ADL 406', and a dielectric layer 434 between the first ADL 406 and the second ADL 406' may form an artificial dielectric. The dielectric layer 434 may be formed by a combination of a layer of the mold compound 402, and the first dielectric layer 438 of the front-side redistribution layer 430. An artificial dielectric typically increases the effective dielectric constant of the dielectric material, which may improve the gain of the antenna by enhancing the amount of radiation in a desired direction indicated by the arrows 432. By having multiple artificial dielectric layers, the effective dielectric constant in the vertical plane may be preferentially increased with respect to other directions. The may further enhance the amount of radiation towards the desired direction indicated by the arrows 432 when the antennas structure is used for transmission. In addition, the selectivity of the antenna structure may be improved when the antennas in the antenna structure 450 are used for receiving.

The third metal layer 412 may include an array of four planar dual-slot antennas 414a-d. The slots are dimensioned to be matched at a required resonant frequency. For example, for car radar applications, dimensions may be selected to be close to one wavelength long at 77 GHz. Typically, the slot length may be chosen to be equivalent to half a wavelength of the radiation in free space. The fourth metal layer 436 may include four corresponding differential feeder structures 428a-d including a differential transmission line. The differential feeder structures 428a-d are operably electromagnetically coupled to the respective dual-slot antenna 414a-d and so no vias are required between the third metal layer 412 and the fourth metal layer 416. Each of the antennas 414a-d may be used for transmission and/or reception.

The integrated circuit package 400 may result in improved antenna performance without the need for a reflector. The antenna structure 450 does not require any vias between any of the metal layers 408, 408', 412, and 416. The integrated circuit package 400 may result in improved antenna-in-package performance with a reduced package size. Since the antenna structure 450 may be implemented as a printed circuit board, the distance between the layers can be more accurately controlled than for example the height of the solder balls 424 with respect to an external printed-circuit board. The performance of the antenna structure 450 in integrated circuit package 400 may be more predictable compared to antenna-in-package solutions that require an external reflector implemented on a printed circuit board.

The artificial dielectric layers 408, 408' may be designed independently of the particular planar antenna and although is implemented so that it is above or overlaps the antenna, there is no requirement for fine alignment between the artificial dielectric layer and the antenna. This may allow implementation using standard printed circuit board thin-film manufacturing techniques.

The integrated circuit package 400 may be implemented using an eWLB package technology or other packaging technologies that include redistribution layers.

Figure 4C:
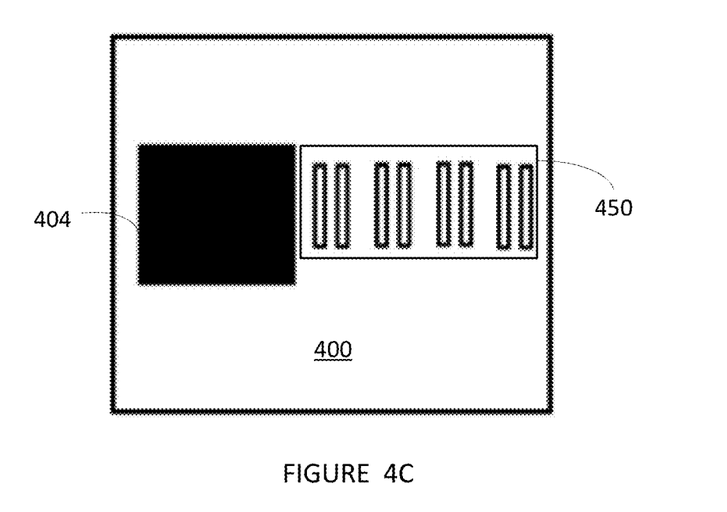
FIG. 4C shows a plan view of the integrated circuit package of FIG. 4A.
Figure 4D:
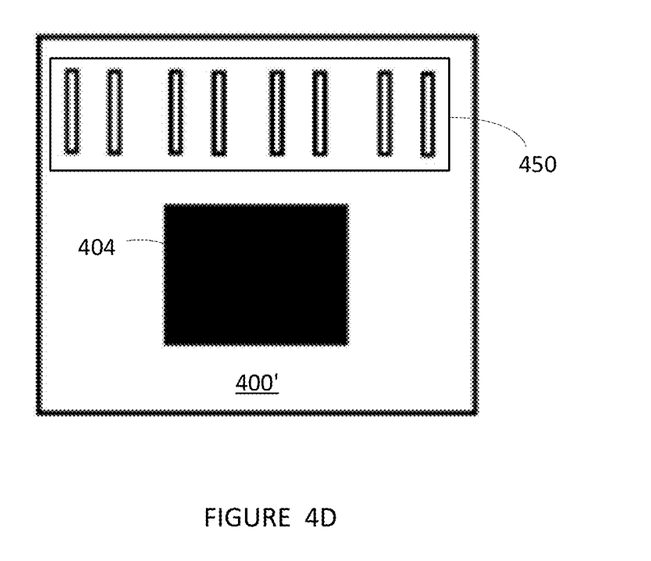
FIG. 4D show a plan view of an integrated circuit package with an alternative arrangement of the die and antenna structure of FIG. 4A.

FIG. 4C shows the integrated circuit package 400 in plan-view indicating the relative placement of the integrated circuit die 404 and the antenna structure 450. FIG. 4D shows a plan view of an alternative integrated circuit package 400' including a different example arrangement of integrated circuit die 404 and antenna structure 450.

Figure 5A:
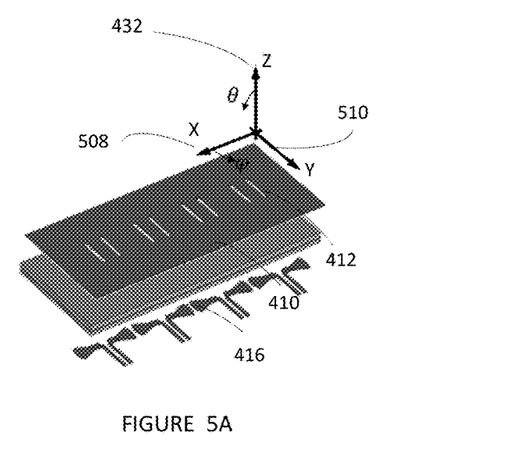
FIG. 5A shows the antenna array of FIG. 4A in operation at a single frequency of 77 GHz indicating the E-plane and H-plane.

FIG. 5A shows the antenna design in the integrated circuit package 400 corresponding to layers 412, 410 and 416 indicating the X-axis 508, Y-axis 510 and the Z-axis 432. The direction of the arrow indicated by the Z-axis indicates the desired direction of propagation 432 of the radiation. The E-plane corresponds to the X-Z plane. the H-plane corresponds to the Y-Z plane. The radiation beam varies between an angle of −☐ to +☐☐ where 0 degrees is orthogonal to the plane of the antenna i.e. parallel to the Z axis 432.

Figure 5B:
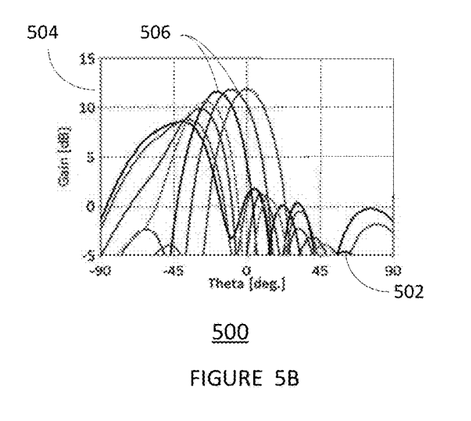
FIG. 5B shows a plot of the radiation patterns in the E-plane for several different scanning angles of the antenna array shown in FIG. 4B when outside the package.

FIG. 5B shows the radiation pattern in the E-plane 500 of the antenna design in the integrated circuit package 400 corresponding to layers 412, 410 and 416. The results show the response when scanning from −45 to 0 degrees. Identical and mirrored patterns may be achieved between 0 and +45 degrees. Larger scanning angles of greater than 45 degrees may be obtained with a larger array i.e. more than 4 antenna elements. The x-axis 502 shows the angle of the radiation (theta) in degrees between −90 and +90 degrees. The y-axis shows the gain ranging from −5 dB to +15 dB. The plot lines 506 shows the gain of the antenna at frequencies between 76 GHz and 81 GHz in 1 GHz increments indicating a respective peak gain for each frequency between approximately −22 degrees and zero degrees.

Figure 5C:
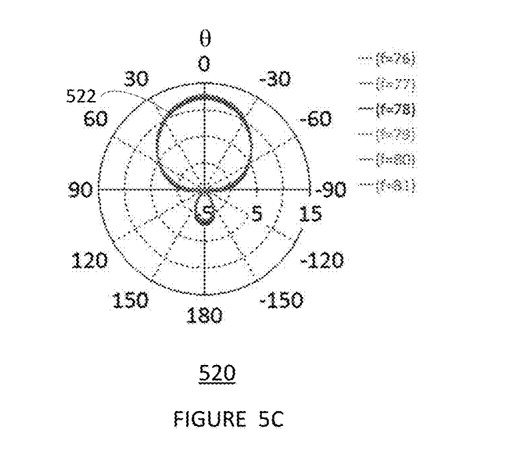
FIG. 5C shows a polar plot of the radiation pattern in the H-plane of the antenna array shown in FIG. 4B when outside the package.

FIG. 5C shows a polar plot 520 of the antenna in the corresponding H-plane 510 for the same frequency range shown as lines 522 at angles of theta between 0 and 360 degrees. As can be seen, the peak radiation for the H-plane has a value theta of 0 degrees for all the frequencies in the range. The graphs of radiation pattern in the E-plane 500 and H-plane 520 represent the response of the antenna before integration into a package with the integrated circuit die 402. The E-plane response 506 shows that the antenna may scan up to 45 degrees. The H-plane response 522 shows a symmetric radiation pattern for the antenna in free space.

Figure 5D:
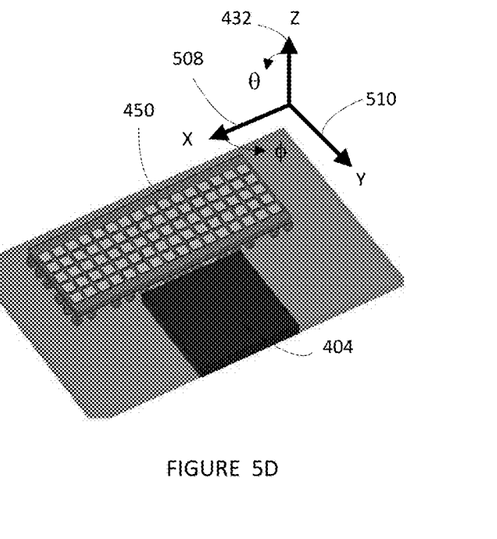
FIG. 5D shows the antenna array of FIG. 4A indicating the E-plane and H-plane in operation.

FIG. 5D shows another view of the integrated circuit package 400' showing the integrated circuit die 404, the antenna structure 450 indicating the X-axis 508, Y-axis 510 and the Z-axis 432. The direction of the arrow indicated by the Z-axis indicates the desired direction of propagation 432 of the radiation. The E-plane corresponds to the X-Z plane. The H-plane corresponds to the Y-Z plane. The radiation beam varies between an angle of −☐ to +☐☐ where 0 degrees is orthogonal to the plane of the antenna i.e. parallel to the Z axis 432.

Figure 5E:
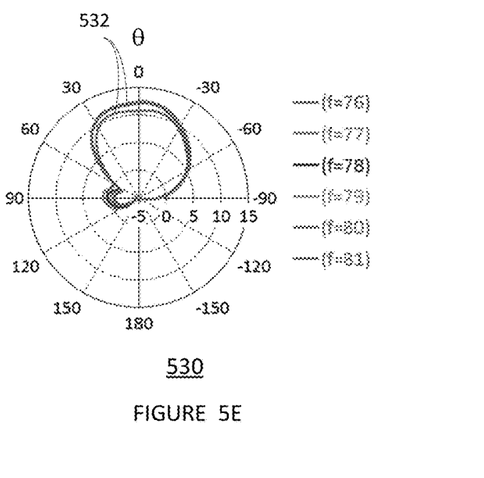
FIG. 5E shows a polar plot of the radiation pattern in the H-plane of the antenna array shown in FIG. 4B when included in the integrated circuit package shown in FIG. 4A.

FIG. 5E shows the polar plot 530 of the simulated H-plane response of the antenna structure integrated into the integrated circuit package 400 for frequencies between 76 GHz and 81 GHz. The plot lines 532 of the antenna array show a relatively small asymmetry due to the presence of the integrated circuit die 402 which indicates that surface wave losses have been reduced. The E-plane response typically does not change with the die included.

Figure 6A:
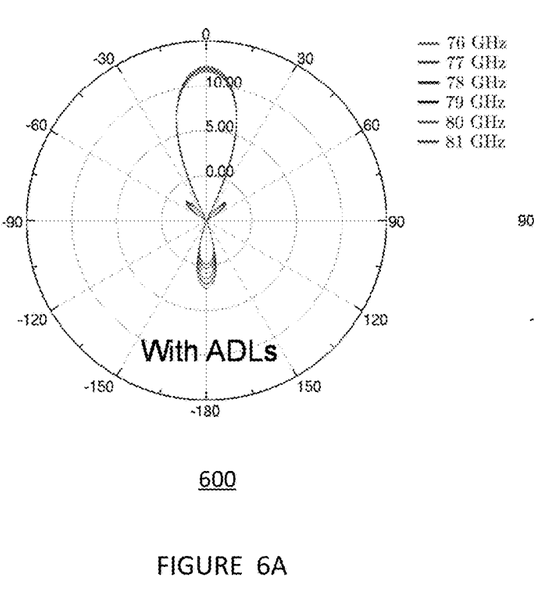
FIG. 6A shows a polar plot of the simulation of a radiation pattern in the E-plane for the antenna-in-package of FIG. 4A.
Figure 6B:
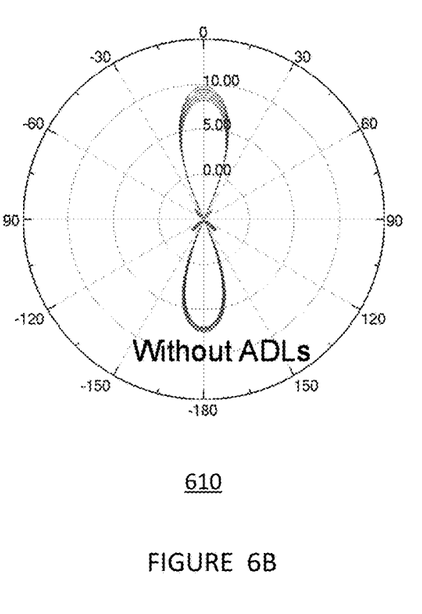
FIG. 6B shows a polar plot of a simulation of the radiation of a similar antenna used for the antenna-in-package of FIG. 4A without the artificial dielectric layers.

The inclusion of ADLs in the hosting dielectric increases the effective permittivity, which may result in improved directionality of the antenna, as illustrated by FIGS. 6A and 6B. For an isotropic material, a high relative permittivity (>10) may cause strong reflections at material-air interface thus supporting surface waves. Due to their anisotropic behaviour, the ADLs synthesize high relative permittivity (>10) for radiation that travels normal to the metal layers, but low effective permittivity for radiation that travels parallel to the metal layers, since the permittivity in the latter direction is determined by the permittivity of the hosting dielectric which is typically much lower for example less than 5. This may reduce the reflection at the top interface of the package and decrease the power lost into surface waves.

FIG. 6A shows a polar plot 600 of the simulation of a radiation pattern in the E-plane for the antenna structure 450 for frequencies between 76 GHz and 81 GHz. FIG. 6B shows a polar plot 610 of a simulation of the radiation of the antenna without the artificial dielectric layers for frequencies between 76 GHz and 81 GHz. In each case the antenna design is identical and the material is identical i.e. the number of metal layers and dielectric layers of the PCB are the same. Plot 600 shows the antenna 450 has a unidirectional radiation pattern. Polar plot 610 shows the antenna that does not include ADLs radiates almost equal power in the up and down direction.

The embodiments herein have been illustrated with the desired radiation antenna towards the opposite surface to the ball grid array. However, it will be appreciated that in other embodiments, the antenna structure may be arranged such that the desired antenna radiation direction is toward the same surface is the ball grid array. In other embodiments, one or more of the antenna structures described may be included in other package technologies than eWLB or BGA packages. In embodiments where the antenna structure is implemented using a multi-layer PCB, the PCB may also be used to implement other interconnects for other components.

Embodiments of the integrated circuit package may be used in mm-wave systems that use an antenna-in-package. For example, the integrated circuit package may be used in 76-81 GHz car radar systems for multi-range (ultra-short, short, medium and long-range) applications such as a parking aid, lateral collision avoidance or other Advance driver assistance system (ADAS) applications and also for gesture recognition. In other examples, the integrated circuit package may be used in mm-wave systems operating above 120 GHz. In other examples, the integrated circuit package may be used in the 60 GHz range for multi-gigabit communications.

An integrated circuit package is described comprising an integrated circuit die and an antenna structure coupled to the integrated circuit die and comprising a stacked arrangement of metal and dielectric layers, wherein a first metal layer includes a planar antenna and at least one further metal layer is at least partially patterned to form an artificial dielectric layer. The integrated circuit package may improve the directionality of the antenna and reduce the sensitivity of the antenna to the printed circuit board on which the integrated circuit package is mounted. The embodiments of the integrated circuit package may remove the requirement for a reflector on the printed circuit board. Embodiments of the integrated circuit package may allow for a thinner antennain-package which has reduced surface wave losses and an improved directionality of the antenna.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The terms "above" and "below" are used to refer to the relative positions of features in the orientation as illustrated and it will be appreciated that these terms may be interchanged as appropriate.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. An integrated circuit package comprising:
an integrated circuit die;
an antenna structure coupled to the integrated circuit die and comprising a stacked arrangement of:
 a first metal layer configured to act as a first artificial dielectric layer (ADL),
 a second metal layer configured to act as a second artificial dielectric layer (ADL), wherein a first dielectric layer separates the first metal layer from the second metal layer and the first ADL and the second ADL are misaligned by design to increase effective permittivity, and
 a third metal layer configured to act as a planar antenna, wherein a second dielectric layer separates the second metal layer from the third metal layer.

2. The integrated circuit package of claim 1, wherein the planar antenna comprises at least two slots.

3. The integrated circuit package of claim 1, further comprising:
an array of four planar antennas.

4. The integrated circuit package of claim 1, wherein the antenna structure comprises a multi-layer printed circuit board (PCB).

5. The integrated circuit package of claim 1, wherein the antenna structure and the integrated circuit die are vertically stacked.

6. The integrated circuit package of claim 1, wherein the integrated circuit die is a monolithic microwave integrated circuit (MMIC).

7. The integrated circuit package of claim 1, further comprising:
a first redistribution layer including a redistribution metal layer, wherein the integrated circuit is electrically connected to the antenna structure via the first redistribution metal layer.

8. The integrated circuit package of claim 7, wherein the redistribution metal layer forms part of the antenna structure.

9. An embedded wafer level ball grid array package comprising the integrated circuit package of claim 7.

10. A radar device for an automotive vehicle, the radar device comprising the integrated circuit package of claim 7.

11. The integrated circuit package of claim 1, further comprising:
a front-side redistribution layer; and
a back-side redistribution layer.

12. The integrated circuit package of claim 1, wherein the third metal layer includes an array of four planar dual-slot antennas.

* * * * *